United States Patent [19]

Cake et al.

[11] Patent Number: 4,804,939

[45] Date of Patent: Feb. 14, 1989

[54] COARSE/FINE A-D CONVERTER USING RAMP WAVEFORM TO GENERATE FINE DIGITAL SIGNAL

[75] Inventors: Brian V. Cake, Monroe, N.Y.; Frederick W. Sippach, Tenafly, N.J.

[73] Assignee: LeCroy Corporation, Chestnut Ridge, N.Y.

[21] Appl. No.: 89,471

[22] Filed: Aug. 25, 1987

Related U.S. Application Data

[63] Continuation of Ser. No. 900,994, Aug. 28, 1986, Pat. No. 4,734,677.

[51] Int. Cl.$^4$ .................. H03M 1/68; H03M 1/36; H03M 1/56
[52] U.S. Cl. .................. 341/156; 324/99 D; 341/169
[58] Field of Search .... 340/347 AD, 347 M, 347 NT; 324/99 D; 328/115-117

[56] References Cited

U.S. PATENT DOCUMENTS 4,099,173 7/1978 Zeskind et al. .............. 340/347 AD
4,559,523 12/1985 Wakita .............................. 375/26 X

OTHER PUBLICATIONS

Schmid, Electronic Analog/Digital Conversions, Van Nostrand Reinhold Company, 1970, pp. 122-126 and 274-279.

Primary Examiner—T. J. Sloyan
Attorney, Agent, or Firm—Curtis, Morris & Safford

[57] ABSTRACT

Analog-to-digital conversion in which a coarse digital representation of an input analog signal is converted to a coarse analog representation, and the difference between the original analog signal and the coarse analog representation is determined. A ramp waveform signal is generated, and a change in that waveform by an amount substantially equal to the difference between the original analog signal and the coarse analog representation is sensed. A plural bit fine digital signal corresponding to the sensed change of the ramp waveform is produced. The combination of the coarse and fine digital signals constitute the digital representation of the input analog signal. In one embodiment, the ramp waveform is increased until it is equal to the difference between the analog signal and the coarse analog representation, whereupon the ramp waveform is digitized. In another embodiment, the ramp waveform is used to reduce the level of a sample of the analog signal until that sample becomes equal to the coarse analog representation, at which time a counter that had been initiated at the commencement of sample reduction is stopped, the count being equal to the fine digital signal.

7 Claims, 2 Drawing Sheets

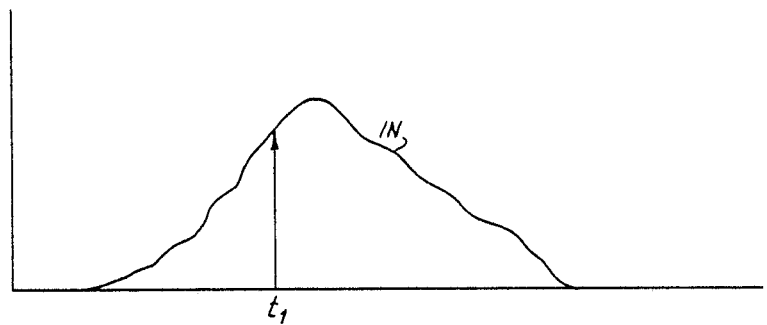
FIG.3A
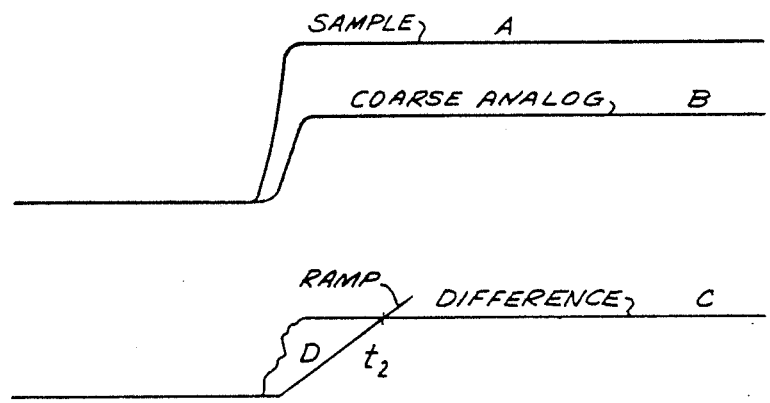
FIG.3B
FIG.3C
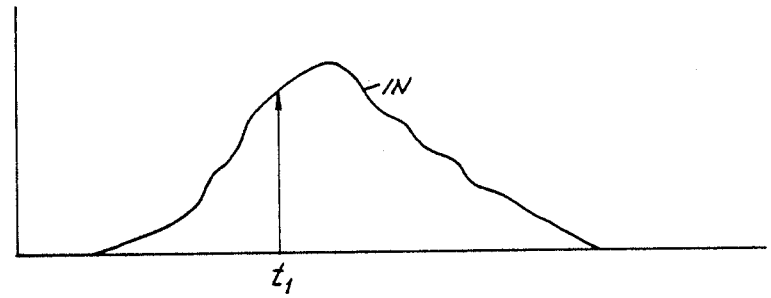
FIG.5A
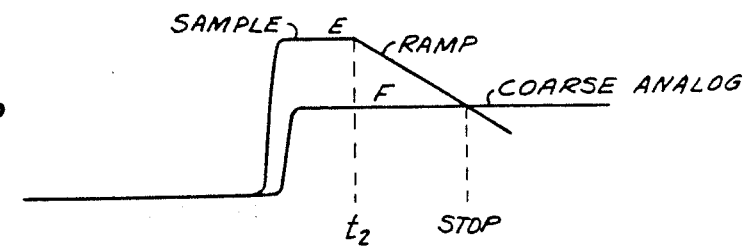
FIG.5B

COARSE/FINE A-D CONVERTER USING RAMP WAVEFORM TO GENERATE FINE DIGITAL SIGNAL

This application is a continuation of application Ser. No. 900,994, filed Aug. 28, 1986, now U.S. Pat. No. 4,734,677, issued Mar. 29, 1988.

BACKGROUND OF THE INVENTION

This invention relates to an analog-to-digital converter and, more particularly, to such an A/D converter that is relatively inexpensive to construct, operates quickly to digitize transient signals and provides an accurate multi-bit (for example, a 12-bit) digital signal.

So-called parallel-serial-parallel A/D converters are known in which two separate stages are used to convert an input analog signal to a plural-bit digital signal. In one example of such parallel-serial-parallel converters, the analog signal is sampled and the sample is converted to, for example, a 4-bit coarse digital representation. This coarse digital representation is re-converted to a coarse analog signal, and the difference between the input analog signal and this coarse analog signal is converted to, for example, a 4-bit fine digital representation. The four bits which comprise the coarse digital signal constitute the bits of greater significance of an 8-bit digital signal, and the bits which comprise the fine digital signal constitute the four bits of lesser significance. However, the fact that the fine bits are produced by means of an A/D converter that operates on the sensed (and changing) difference between the original analog signal and the coarse analog representation thereof may introduce errors into the accuracy of the fine digital representation. Also, the coarse and fine A/D converters may operate too slowly for the successful digital conversion of an input transient signal that varies at high frequencies.

Another example of a previously proposed A/D converter utilizes a ramp waveform signal of, for example, increasing magnitude, which is compared to a sample of the input analog signal. A clock pulse counter is turned on concurrently with the ramp waveform and is turned off when that waveform reaches the sample level. The resultant count of the clock pulse counter is a digital representation of the analog sample. Unfortunately, the time required for this counting is sufficiently long that this A/D converter is not desirable for digitizing rapidly changing transient signals.

A variation of the last-mentioned A/D converter employs a negative ramp waveform to discharge a capacitor across which the analog sample is stored; and the clock pulse counter is turned off when the capacitor is discharged to zero. However, this A/D converter suffers from the same disadvantages mentioned above.

OBJECTS OF THE INVENTION

Therefore, it is an object of the present invention to provide an improved A/D conversion technique.

Another object of this invention is to provide an improved method and apparatus for analog-to-digital conversion which avoids the aforementioned disadvantages.

A further object of this invention is to provide an A/D conversion technique which operates at sufficiently high speeds as to be capable of digitizing a rapidly varying transient analog signal.

An additional object of this invention is to provide an improved A/D conversion technique in which an accurate digital representation of high resolution (e.g. on the order of 12 bits or more) can be obtained from an input analog signal.

Various other objects, advantages and features of the present invention will become readily apparent from the ensuing detailed description, and the novel features will be particularly pointed out in the appended claims.

SUMMARY OF THE INVENTION

In accordance with this invention, a method and apparatus for converting an input analog signal to a plural-bit digital signal are provided. A coarse digital representation of the input signal is produced, and this coarse digital representation is converted to a coarse analog signal. A ramp waveform is generated, and when this ramp waveform has undergone a change in magnitude by an amount substantially equal to the difference between the input analog signal and the coarse analog signal, a fine digital signal corresponding to that change is produced. The coarse and fine digital signals constitute the bits of greater significance and lesser significance respectively, in the output digital signal.

In accordance with one embodiment of this invention, the ramp waveform is compared to the difference between the input analog and coarse analog signals, and when the magnitude of the ramp waveform is substantially equal to that difference, the ramp waveform is converted to a digital signal by, for example, a "flash" A/D converter. In this embodiment, the ramp waveform may be increasing or decreasing, as desired.

In accordance with another embodiment of the invention, the input analog signal is sampled and stored, and the ramp waveform is used to change the stored sample until it becomes substantially equal to the coarse analog signal. A counter, such as a clock pulse counter, is turned on at the commencement of the change in the stored analog sample and is turned off when that sample reaches the level of the coarse analog signal. The resultant count constitutes the fine digital signal. In this embodiment, the analog sample is stored on a capacitor, and the ramp waveform is a negative waveform which discharges the capacitor. The number of pulses which are counted while the capacitor is discharged to the coarse analog signal level is used to produce the fine bits (i.e. the bits of lesser significance) of the output digital signal.

BRIEF DESCRIPTION OF THE DRAWINGS

The following detailed description, given by way of example and not intended to limit the present invention solely to the embodiments described herein, will best be understood in conjunction with the accompanying drawings in which:

FIGS. 3A–3C are waveform diagrams which are useful in understanding the operation of the embodiment shown in FIG. 2;

FIGS. 5A and 5B are waveform diagrams which are useful in understanding the operation of the embodiment shown in FIG. 4.

DETAILED DESCRIPTION OF CERTAIN PREFERRED EMBODIMENTS

Figure 1:
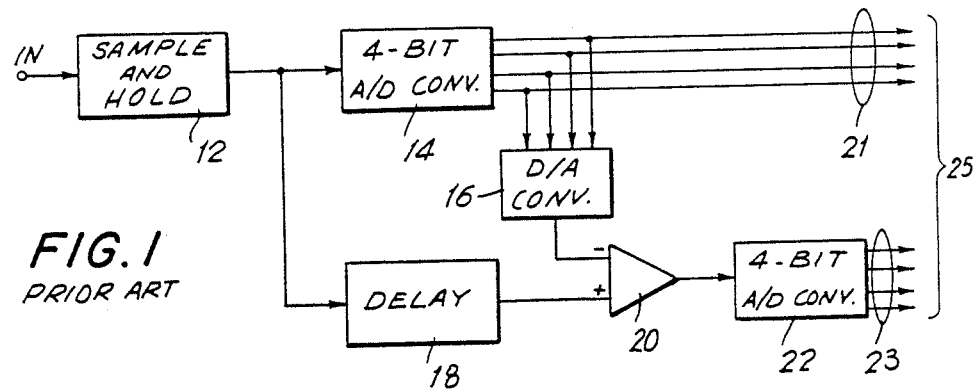
FIG. 1 is a block diagram of a prior art parallel-serial-parallel A/D converter.

Before describing the present invention, reference is made to FIG. 1 in which a typical example of a prior art parallel-serial-parallel A/D converter is illustrated. The illustrated converter comprises a sample-and-hold circuit 12, an A/D converter 14, a D/A converter 16, a summing amplifier 20, and another A/D converter 22. Sample and hold circuit 12 is a conventional sampling device, for example, an electronic switch, which functions to sample the input analog signal level. As is typical, the sample-and-hold circuit includes a storage device, such as a simple storage capacitor, across which the analog sample is stored. It will be appreciated, although not shown herein, that a suitable timing circuit is provided to supply sampling pulses to sample-and-hold circuit 12. A/D converter 14 is coupled to sample-and-hold circuit 12 and operates to convert the stored analog sample to a digital signal. Typically, to minimize costs, A/D converter 14 exhibits relatively low resolution and may comprise, for example, a 4-bit converter. As a result of the conventional operation of A/D converter 14, a 4-bit digital signal related to the stored analog sample is produced at outputs 21 coupled to the A/D converter. It is appreciated by those of ordinary skill in the art that the digital representation produced by A/D converter 14 is a coarse representation of the input analog sample. The outputs of A/D converter 14 also are coupled to D/A converter 16. This latter converter is of conventional construction and serves to produce an analog signal in response to the digital representations supplied thereto. Since a A/D converter 14 produces a coarse digital signal, it is appreciated that D/A converter 16 similarly produces a coarse analog signal corresponding to the digital representations supplied thereto. In view of the relatively low resolution of A/D converter 14, it is expected that the coarse analog signal produced by D/A converter 16 differs from the input analog sample produced by sample-and-hold circuit 12.

The coarse analog signal produced by the D/A converter is supplied to one input of amplifier 20, and the other input of this amplifier is supplied with the stored analog sample produced by sample-and-hold circuit 12. A conventional delay circuit 18 is interposed between the sample-and-hold circuit and the summing amplifier in order to account for the inherent delays found in converters 14 and 16. Amplifier 20 functions as a difference circuit to produce a difference output signal substantially equal to the difference between the stored input analog sample and the coarse analog signal. This difference signal is supplied to A/D converter 22, which may be similar to aforementioned A/D converter 14, and which produces at its outputs 23 a digital representation of the difference signal produced by difference circuit 20. As an example, A/D converter 22 may comprise a 4-bit converter to produce at outputs 23 a 4-bit representation of the difference signal supplied by difference circuit. The combination of outputs 21 and 23 may be thought of as output terminals 25 at which an 8-bit digital signal corresponding to the input analog signal is produced. The coarse digital representation provided at outputs 21 constitutes the bits of greater significance of the resultant 8-bit digital signal and the fine digital representation provided at outputs 23 constitutes the bits of lesser significance of this 8-bit digital signal. In combination, therefore, the coarse and fine bits (or bits of greater and lesser significance) provide an 8-bit digital representation of each input analog sample produced by sample-and-hold circuit 12.

However, summing amplifier 20 must be stable, settle quickly, and have excellent overload recovery, especially since the difference between the signal levels supplied thereto may be quite large when a rapidly changing input signal is to be digitized. Amplifiers generally are not available with the foregoing characteristics. Moreover, summing amplifiers which attempt to satisfy these requirements are very expensive.

The present invention avoids the need for such a summing amplifier; and one embodiment now will be described in conjunction with the block diagram illustrated in FIG. 2. This embodiment is comprised of sample-and-hold circuit 12, an A/D converter 24, a D/A converter 26, a difference circuit 28, a comparator 30, a ramp generator 32 and an A/D converter 34. Sample-and-hold circuit 12 may be substantially identical to the sample-and-hold circuit described above in conjunction with the prior art A/D converter shown in FIG. 1. It is appreciated, therefore, that this sample-and-hold circuit samples in input analog signal and stores each sample temporarily until that sample is converted into a digital representation thereof.

The output of sample-and-hold circuit 12 is coupled to A/D converter 24. In the preferred embodiment, A/D converter 24 is comprised of a so-called "flash" converter known to those of ordinary skill in the art. Preferably this flash A/D converter exhibits desirable resolution and, for example, produces a 7-bit signal corresponding to the analog signal supplied thereto by sample-and-hold circuit 12. A/D converter 24 is coupled to coarse bit outputs 31 of converter 24. As will be described below, outputs 31 provide the bits of greater significance (i.e. the more significant bits) of the digital signal produced by the converter shown in FIG. 2.

A/D converter 24 also is coupled to D/A converter 26 which may be similar to aforementioned D/A converter 16. If A/D converter 24 comprises a 7-bit converter, D/A converter 26 is compatible therewith and is adapted to produce an analog signal in response to the 7-bit digital signal supplied thereto. The analog signal produced by converter 26 is a coarse analog signal.

Difference circuit 28 has one input coupled to sample-and-hold circuit 12 and another input coupled to D/A converter 26. Because of the fast operation of a flash A/D converter, difference circuit 28 need not exhibit the limited and expensive characteristics of summing amplifier 20. Rather, it may comprise, for example, a simple differential operational amplifier. In the embodiment illustrated herein, difference circuit 28 is adapted to subtract the analog signal supplied by D/A converter 26 from the analog signal supplied by sample-and-hold circuit 12. As a result, the difference circuit produces a difference signal representative of the difference therebetween. The output of difference circuit 28 is coupled to one input of comparator 30, and the other input of this comparator is coupled to ramp generator 32. Comparator 30 may comprise a differential amplifier or other conventional circuit which is adapted to compare two analog signals and to sense when those analog signals exhibit a predetermined relationship. In the embodiment described herein, comparator 30 functions to detect when the signals supplied to the respective inputs thereof are substantially equal to each other. The comparator is adapted to produce an enable, or "strobe" signal when the magnitude of the signal supplied thereto by ramp generator 32 is substantially equal to the magnitude of the signal supplied thereto by difference circuit 28. This strobe signal is coupled to an enable input of A/D converter 34 to initiate the conversion operation thereof. As illustrated, this converter also is coupled to ramp generator 32 and is adapted to digitize the level attained at the output of the ramp generator at the time that the strobe signal is produced by comparator 30. A/D converter 34 preferably is a "flash" converter and may be similar to aforementioned flash A/D converter 24. Accordingly, converter 34 is adapted to produce at outputs 33, referred to as the fine bit outputs, a 7-bit digital signal. The fine digital signal produced at fine bit outputs 33 constitutes the bits of lesser significance of the plural-bit digital signal that is provided at the combined outputs 31 and 33.

Figure 2:
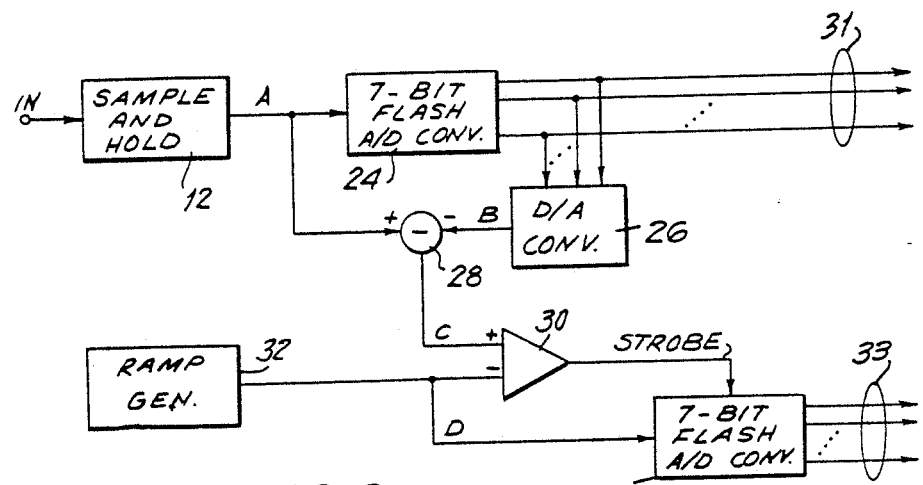
FIG. 2 is a block diagram of one embodiment of the present invention.

In one version of the embodiment shown in FIG. 2, ramp generator 32 is adapted to generate a positive-going ramp waveform signal. In an alternative version, the ramp generator provides a negative-going ramp waveform. The polarity of the ramp waveform is not material to the successful operation of the illustrated embodiment. This is because the level which has been attained by the ramp waveform at the time that waveform is equal to the difference signal produced by difference circuit 28 is converted by A/D converter 34 to a digital representation. The same level is attained for conversion whether the ramp waveform is positive-going or negative-going.

The manner in which the embodiment illustrated in FIG. 2 operates now will be described in conjunction with the waveforms illustrated in FIGS. 3A-3C. It is seen that these waveforms are identified with the same reference characters as used in FIG. 2 so as to identify the waveforms of those signals produced by the respective circuits. FIG. 3A represents the input analog signal which, for the purpose of the present discussion, may be thought of as a transient signal having a rapidly changing magnitude. It is assumed that the input analog signal is sampled at a time $t_1$, as illustrated in FIG. 3A.

Waveform A, shown in FIG. 3B, represents the analog sample produced at the output of sample-and-hold circuit 12 and, as illustrated, the magnitude of this waveform A is substantially equal to the magnitude of the input analog signal (FIG. 3A) at sample time $t_1$. It is appreciated that the sample-and-hold circuit includes a storage, or holding, capacitor which maintains a substantially constant waveform A from one sampling operation to the next. The sampled analog signal represented by waveform A is converted to a digital representation by A/D converter 24. In the embodiment described herein, it is assumed that the A/D converter is a 7-bit "flash" converter, known to those of ordinary skill in the art. The resultant 7-bit digital representation of waveform A is re-converted to an analog representation by D/A converter 26, this analog representation being illustrated as the coarse analog signal represented by waveform B in FIG. 3B. It will be recognized that, because of the relatively limited quantization resolution of A/D converter 24, the re-conversion of the digital signal produced by that A/D converter normally is expected to differ from the input analog signal of waveform A. This difference is shown in FIG. 3B.

Difference circuit 28 operates to subtract the coarse analog signal of waveform B from the input analog sample of waveform A, resulting in the difference signal represented by waveform C of FIG. 3C. This difference signal of waveform C is compared in comparator 30 to the ramp waveform produced by ramp generator 32 and represented by waveform D in FIG. 3C. Ramp waveform D is illustrated as a positive-going waveform and intersects the difference signal waveform C at time $t_2$. At the time that the ramp waveform is substantially equal to the difference signal, comparator 30 applies a trigger signal to A/D converter 34 which produces a digital representation of the magnitude attained by ramp waveform D at time $t_2$. Thus, the digital signal produced by converter 34 represents the difference between the input analog sample (waveform A) and the coarse analog signal (waveform B). In the example shown in FIG. 2, A/D converter 34 preferably is a 7-bit "flash" converter similar to aforementioned 7-bit "flash" converter 24.

The output terminals of the illustrated A/D converter are formed of coarse bit outputs 31 and fine bit outputs 33. As is conventional, the least significant bit of the coarse bit outputs and the most significant bit of the fine bit outputs may be combined, or selected bits of the coarse and fine bit outputs may be processed to produce a 12-bit digital signal from the 14-bits supplied to outputs 31 and 33. In the event that the least significant bit of coarse bit outputs 31 differs from the most significant bit of fine bit outputs 33, correction may be obtained to obviate any ambiguity.

While the embodiment shown in FIG. 2 operates satisfactorily, it is known that a "flash" A/D converter may introduce a relatively minor (yet acceptable) error into the signal digitized thereby. This error relates to the linear relationship between the analog signal supplied to the flash converter and the digital signal produced thereby. Such nonlinearities may be corrected for one flash converter; but these corrections become more difficult when two flash converters are used.

Figure 4:
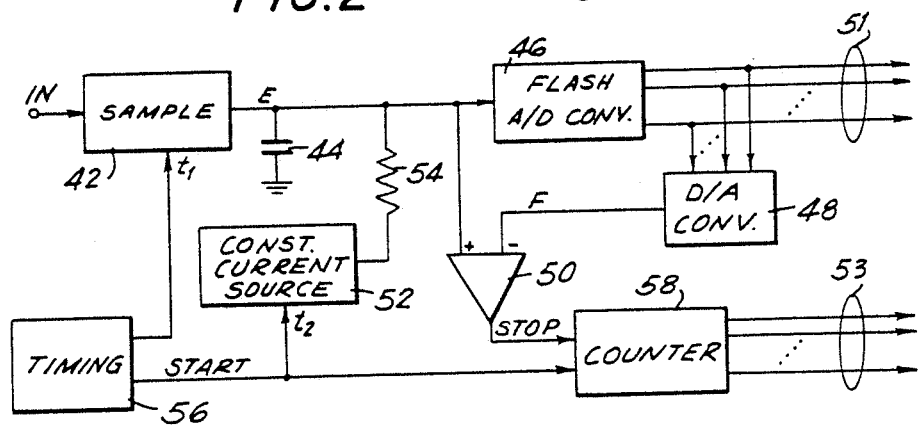
FIG. 4 is a partial block, partial schematic diagram of another embodiment of the present invention.

Another embodiment of the present invention in which only one flash converter is used is illustrated in FIG. 4. This embodiment is comprised of a sampling circuit 42, a storage capacitor 44, an A/D converter 46, a D/A converter 48, a comparator 50, a constant current 52 and a counting circuit 58. Sampling circuit 42 may be of conventional construction and is adapted to obtain periodic samples of the input analog signal supplied thereto. In this regard, sampling circuit 42 may be coupled to a timing signal generator 56 to receive sampling pulses designated $t_1$. That is, at time $t_1$ during each sampling interval, the input analog signal is sampled by sampling circuit 42.

Storage capacitor 44 is coupled to sampling circuit 42 and is adapted to store the sample of the input analog signal produced by the sampling circuit. In this regard, the combination of sampling circuit 42 and storage capacitor 44 corresponds to aforementioned, conventional sample-and-hold circuit 12. The output of storage capacitor 44, that is, the sample stored thereacross, is coupled to A/D converter 46 which may be similar to aforementioned converter 24.

A/D converter 46 is adapted to produce a coarse digital representation of the analog sample stored on storage capacitor 44. Coarse bit outputs 51 are coupled to A/D converter 46 for supplying the coarse digital representation to further circuitry. It is appreciated that coarse bit outputs 51 furnish the more significant bits of the digital signal produced by the illustrated analog-to-digital converter. This coarse digital representation is supplied to D/A converter 48 which may be similar to aforedescribed D/A converter 26. Accordingly, converter 48 is adapted to produce a coarse analog signal from the coarse digital representations supplied thereto. This coarse analog signal is supplied as one input to comparator 50.

Comparator 50 may comprise a differential amplifier or other difference circuit, similar to comparator 30 or to difference circuit 28 (both shown in FIG. 2), and is adapted to sense when the respective magnitudes of two analog signals supplied thereto are substantially equal. As shown, one input (for example, the inverting input) of comparator 50 is coupled to D/A converter 48 and the other input thereof (e.g. the non-inverting input) is coupled to storage capacitor 44 to receive the analog sample stored thereacross. An output signal is produced by comparator 50 when the two input signals supplied thereto are substantially equal. As shown, the output of comparator 50 is coupled to counting circuit 58 and is adapted to supply a "stop" signal to this counting circuit.

Constant current source 52 is coupled to storage capacitor 44. This source responds to an initiating signal, such as a "start" signal, supplied at time $t_2$, to provide a constant current which is integrated by capacitor 44 to produce a negative-going ramp waveform having a substantially constant, predetermined slope.

In the preferred embodiment shown in FIG. 4, the "start" signal supplied by timing signal generator 56 to current source 52 also is coupled to counting circuit 58 to initiate the operation of the counting circuit. Although not illustrated herein, it is appreciated that a suitable source of timing pulses supplies those pulses to the counting circuit whose counting operation commences upon receipt of the "start" signal. The operation of this counting circuit is terminated in response to the "stop" signal produced by comparator 50. Hence, counting circuit 58 provides an output count at fine bit outputs 53 which represents the time required for the analog sample stored across storage capacitor 44 to be reduced in magnitude to the level of the coarse analog signal produced by D/A converter 48. Since storage capacitor 44 discharges at a known, predetermined rate, the duration of this discharge thus is a function of the difference between the stored analog sample and the coarse analog signal. Hence, the digital representation supplied to fine bit outputs 53 by counting circuit 58 is a digitized representation of that difference.

As in the embodiment shown in FIG. 2, the combination of coarse bit outputs 51 and fine bit outputs 53 constitutes the digital outputs of the illustrated analog-to-digital converter.

The manner in which the circuit illustrated in FIG. 4 operates now will be described in conjunction with the waveform diagrams shown in FIGS. 5A and 5B. The input analog waveform is illustrated in FIG. 5A and, for the purpose of the present discussion and for consistency herein, is seen to be substantially the same as the input analog waveform shown in FIG. 3A. This analog waveform is supplied to sampling circuit 42 and is sampled at time $t_1$. It is seen that the magnitude of the input analog signal at time $t_1$ thus is stored across storage capacitor 44, as represented by waveform E in FIG. 5B.

The stored analog sample (waveform E) is converted by A/D converter 46 to a coarse digital representation supplied to outputs 51; and the resultant coarse digital signal is re-converted to a coarse analog signal by D/A converter 48. The re-converted coarse analog signal is illustrated as waveform F in FIG. 5B.

At time $t_2$, which is subsequent to the sampling time $t_1$ and subsequent to the time that D/A converter 48 produces a steady-state coarse analog signal, current source 52 (or the equivalent discharge circuit) is triggered by timing signal generator 56. As a result, storage capacitor 44 is discharged in a linear manner, as represented by waveform E in FIG. 5B. It will be appreciated that, while storage capacitor 44 is being discharged, that is, at times subsequent to time $t_2$, the coarse analog signal output of D/A converter 48 is maintained substantially constant. In this manner, the discharge of capacitor 44 is not reflected as a corresponding reduction in the level of the coarse analog signal.

At time $t_2$, the counting operation of counting circuit 58 is initiated, as represented by the "start" signal supplied thereto by timing signal generator 56. Thus, the count of this counting circuit is incremented until the "stop" signal produced by comparator 50 is applied. As shown in FIG. 5B, the "stop" signal is generated when capacitor 44 is discharged to a level substantially equal to the coarse analog signal. The duration between the "start" and "stop" times, which is represented by the count attained by counting circuit 58, is a function of the difference between waveforms E and F. Stated otherwise, this count, which constitutes the bits of lesser significance of the output digital signal produced by the analog-to-digital converter illustrated in FIG. 4, is a function of the change in the ramp waveform level, as shown in FIG. 5B. The fine bits of outputs 53 in combination with the coarse bits at outputs 51 constitute the digital representation of the input analog signal.

While the present invention has been particularly shown and described with reference to preferred embodiments, it will be readily appreciated by those of ordinary skill in the art that various changes and modifications may be made without departing from the spirit and scope of the invention. For example, in the embodiments of FIGS. 2 and 4, comparators 30 and 50, respectively, function to sense when the ramp waveform signal generated by ramp generator 32, 52 has changed by an amount substantially equal to the difference between the input analog sample (waveforms A and E) and the coarse analog signal (waveforms B and F). It is appreciated, therefore, that the ramp waveform produced by ramp generator 32, for example, may comprise a negative-going signal which commences at some higher magnitude and is reduced, at time $t_2$ (FIG. 3C) to the difference signal level shown in waveform. C. Similarly, the ramp waveform produced from current source 52 may comprise a positive-going waveform that is used to charge a capacitor across which the coarse analog signal is stored until the voltage across that capacitor attains a level substantially equal to the input analog sample of waveform E (FIG. 5B). As a still further alternative, the embodiment shown in FIG. 2 can be modified to the extent that a counting circuit similar to counting circuit 58 replaces flash A/D converter 34. In such a modification, the counting operation of such a counting circuit is initiated when ramp generator 32 commences its ramp waveform and the counting operation is interrupted when the ramp waveform level is substantially equal to the difference signal of waveform C at time $t_2$. In such an alternative embodiment, the counting circuit accumulates a count corresponding to the time period for the ramp waveform to increase to the level of waveform C. Since this time period is related to the magnitude of waveform C, it is appreciated that the count attained by the counting circuit thus is representative of the difference between the input analog sample produced by sample-and-hold circuit 12 and the coarse analog signal produced by D/A converter 26.

In the aforedescribed embodiments, comparators 30 and 50 function to sense when the signals supplied thereto are substantially equal to each other. It will be appreciated that, if desired, the strobe, or enable, signal produced by comparator 30 as well as the "stop" signal produced by comparator 50 may be generated when the two signals supplied to the comparator exhibit a predetermined relationship. For example, when one signal is greater by a predetermined amount than the other, the strobe and "stop" signals may be generated.

Counting circuit 58 may comprise a conventional counter supplied with counting pulses of predetermined frequency. As an example, timing circuit 56 may supply timing pulses to the counting circuit, such counting pulses commencing at time $t_2$ (FIG. 5B). The counting circuit may comprise a conventional clock counter known to those of ordinary skill in the art. It also is appreciated that various equivalent circuit means may be used to furnish the count attained by counting circuit 58 at the time that the "stop" signal is produced by comparator 50. For example, the counting circuit may be coupled to a suitable register that is "latched" in response to this "stop" signal.

In the embodiments of FIGS. 2 and 4, it is preferred that the respective A/D converters 24, 34 and 46 are "flash" converters, such as conventional 7-bit flash A/D converters. It will be appreciated that the embodiments described herein improve the resolution of the analog-to-digital converter from the prior art 8-bit resolution to 12-bit or 14-bit resolution.

Although not illustrated, it will be appreciated that conventional timing circuitry may be used with the embodiment of FIG. 2 to determine the sampling times and to provide suitable clock pulses for synchronizing the various operations carried out by the respective circuits.

It is intended that the appended claims be interpreted as including those changes mentioned herein as well as other variations and modifications which are equivalent to the disclosed embodiments.

What is claimed is:

1. In an analog-to-digital converter of the type having a first stage for producing a coarse digital representation of an input analog singal, digital-to-analog converting means for producing a coarse analog signal derived from said coarse digital representation, and means for producing a fine digital representation of the difference between said input analog signal and said coarse analog signal, which means normally includes a summing amplifier for producing said difference, the improvement by which the summing amplifier is obviated comprising a first flash analog-to-digital converter for producing said coarse digital representation; means for generating a ramp waveform signal; a difference circuit for producing a difference signal proportional to said difference between said input analog signal and said coarse analog signal derived from said flash analog-to-digital converter; sensing means for sensing when said ramp waveform signal has changed by an amount substantially equal to said difference signal; and a second flash analog-to-digital converter coupled to said means for generating a ramp waveform signal and responsive to said sensing means for producing a plural bit digital signal corresponding to the sensed change of said ramp waveform signal.

2. The improvement of claim 1 wherein said sensing means comprises comparator means coupled to said difference circuit and said means for generating a ramp waveform signal for comparing said ramp waveform signal to said difference signal to produce an enable signal when the compared signals exhibit a predetermined relationship.

3. The improvement of claim 2 wherein said second flash analog-to-digital converter is responsive to said enable signal to produce said plural bit signal representing the then-present magnitude of said ramp waveform signal.

4. The improvement of claim 3 wherein said means for generating a ramp waveform signal generates a positive ramp waveform signal whose magnitude increases with time.

5. An analog-to-digital converter comprising:
sampling means for sampling an input analog signal;
first A/D converting means coupled to said sampling means to produce a coarse digital representation of an input sample;
D/A converting means coupled to said first A/D converting means for producing a coarse analog representation of said coarse digital representation;
difference means coupled to said sampling means and to said D/A converting means for producing a difference signal as a function of the difference between said input sample and said coarse analog representation;
ramp generating means for generating a ramp waveform commencing from a reference level;
comparator means coupled to said ramp generating means and to said difference means for detecting when the level of said ramp waveform is substantially equal to said difference signal to produce a strobe signal; and
second A/D converting means coupled to said ramp generating means and responsive to said strobe signal to produce a fine digital representation of said ramp waveform, the combination of said coarse and fine digital representations comprising the output of said analog-to-digital converter.

6. The analog-to-digital converter of claim 5 wherein said coarse digital representation constitutes the more significant bits of the analog-to-digital converter output, and said fine digital representation constitutes the less significant bits of the analog-to-digital converter output.

7. The analog-to-digital converter of claim 5 wherein said ramp waveform is a positive waveform.

* * * * *